United States Patent
Hovel et al.

(10) Patent No.: US 6,602,757 B2
(45) Date of Patent: Aug. 5, 2003

(54) SELF-ADJUSTING THICKNESS UNIFORMITY IN SOI BY HIGH-TEMPERATURE OXIDATION OF SIMOX AND BONDED SOI

(75) Inventors: Harold J. Hovel, Katonah, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/861,594

(22) Filed: May 21, 2001

(65) Prior Publication Data

US 2002/0171106 A1 Nov. 21, 2002

(51) Int. Cl.$^7$ .................. M01L 21/76; M01L 21/30
(52) U.S. Cl. .................. 438/407; 438/404; 438/408; 438/423; 438/459; 438/517
(58) Field of Search .................. 438/404–408, 438/745, 743, 480, 766, 459, 517, 423, 526, 528; 257/347, 348, 355, 350

(56) References Cited

U.S. PATENT DOCUMENTS

| | | | |
|---|---|---|---|
| 4,749,660 A | * 6/1988 | Short et al. | 438/766 |
| 4,786,608 A | 11/1988 | Griffith | |
| 4,902,642 A | 2/1990 | Mao et al. | |
| 4,975,126 A | 12/1990 | Margail et al. | |
| 5,196,355 A | * 3/1993 | Wittkower | 438/766 |
| 5,279,978 A | 1/1994 | See et al. | |
| 5,288,650 A | * 2/1994 | Sandow | 438/766 |
| 5,360,752 A | * 11/1994 | Brady et al. | 438/459 |

(List continued on next page.)

FOREIGN PATENT DOCUMENTS

JP    63 217657    9/1988

OTHER PUBLICATIONS

Wolf, S., "Silicon Processing for the VLSI ERA", vol. 2: Process Integration, 1990, pp. 72–73.

White, A.E., et al., "The role of implant temperature in the formation of thin buried oxide layers", Beam–Solid Interactions and Transient Processes Symposium, Boston, MA, USA, Dec. 1–4, 1986, pp. 585–590, XP000922701.

*Primary Examiner*—Michael S. Lebentritt
(74) *Attorney, Agent, or Firm*—Scully, Scott, Murphy & Presser; Robert M. Trepp (57) ABSTRACT

A silicon-on-insulator substrate having improved thickness uniformity as well as a method of fabricating the same is provided. Specifically, improved thickness uniformity of a SOI substrate is obtained in the present invention by subjecting a bonded or SIMOX (separation by ion implantation of oxygen) SOI substrate to a high-temperature oxidation process that is capable of improving the thickness uniformity of said SOI substrate. During this high-temperature oxidation process surface oxidation of the superficial Si-containing (i.e., the Si-containing layer present atop the buried oxide (BOX) region) occurs; and (ii) internal thermal oxidation (ITOX), i.e., diffusion of oxygen via the superficial Si-containing layer into the interface that exists between the BOX and the superficial Si-containing layer also occurs. Uniformity is achieved since regions of the SOI substrate which have thicker Si get less ITOX, but more surface oxidation create a thicker surface oxide (and hence thinner superficial Si-containing layer). However, regions of the SOI substrate which are thinner get more ITOX and have thinner surface oxide (and hence thicker superficial Si-containing). This mechanism continues to self-adjust the SOI substrate thickness with oxidation time to improve the SOI thickness uniformity. It has been observed that the closer the oxidizing surface is to the BOX, the more uniform the superficial Si-containing layer becomes.

38 Claims, 3 Drawing Sheets

U.S. PATENT DOCUMENTS

| | | |
|---|---|---|
| 5,519,336 A | 5/1996 | Liu et al. |
| 5,589,407 A * | 12/1996 | Meyyappan et al. ......... 438/766 |
| 5,891,743 A * | 4/1999 | Lowell ....................... 438/407 |
| 5,930,643 A | 7/1999 | Sadana et al. |
| 6,043,166 A | 3/2000 | Roitman et al. |
| 6,054,363 A * | 4/2000 | Sakaguchi et al. .......... 438/406 |
| 6,090,689 A | 7/2000 | Sadana et al. |
| 6,259,137 B1 * | 7/2001 | Sadana et al. ............... 257/347 |
| 6,300,218 B1 * | 10/2001 | Cohen et al. ............... 438/423 |
| 6,410,962 B2 * | 6/2002 | Geissler et al. ............. 257/355 |
| 6,461,933 B2 * | 10/2002 | Houston ..................... 438/423 |
| 6,495,429 B1 * | 12/2002 | Adamcek et al. ........... 438/407 |
| 6,503,783 B1 * | 1/2003 | Mouli ........................ 438/154 |
| 6,515,333 B1 * | 2/2003 | Riccobene .................. 257/347 |
| 2001/0024876 A1 * | 9/2001 | Sakaguchi et al. .......... 438/689 |
| 2001/0033002 A1 * | 10/2001 | Norcott et al. .............. 257/353 |
| 2001/0053607 A1 * | 12/2001 | Sakaguchi et al. .......... 438/700 |

\* cited by examiner

SELF-ADJUSTING THICKNESS UNIFORMITY IN SOI BY HIGH-TEMPERATURE OXIDATION OF SIMOX AND BONDED SOI

CROSS RELATED APPLICATIONS

This application is related to U.S. application Ser. No. 09/861,593; U.S. application Ser. No. 09/861,596; and U.S. application Ser. No. 09/861,590, the entire contents of each are incorporated herein by reference.

FIELD OF THE INVENTION

The present invention relates to silicon-on-insulator (SOI) substrates for use in the semiconductor industry for fabricating integrated circuits (ICs), and more particularly to a method for improving the thickness uniformity of the top superficial Si-containing layer of a SOI substrate. The SOI substrate may be a preformed SOI substrate or a SOI substrate that is prepared in-situ.

BACKGROUND OF THE INVENTION

Silicon-on-insulator (SOI) thickness and thickness uniformity requirements for future generation of complementary metal oxide semiconductor (CMOS) devices and circuits are becoming highly demanding. Typically, SOI thickness targets are from about 100 to about 2500 Å with a thickness uniformity of about ±2% over a 200 mm Si wafer. This is because the threshold voltage, $V_t$, of today's generation of CMOS devices can be strongly dependent on the SOI thickness, especially in the low thickness range.

Thickness uniformity of present commercially available SOIs made either by conventional SIMOX or bonding is quite inadequate to meet the required thickness control targets. A typically SOI substrate of the prior art is shown, for example, in FIG. 1. Specifically, the SOI substrate shown in FIG. 1 comprises bottom Si-containing substrate 10, buried oxide (BOX) region 12 formed on the bottom Si-containing substrate, and superficial Si-containing layer 14 having a surface with roughness variation. Note that the area above the dotted line represents the thickness non-uniformity in the superficial Si-containing layer that is formed from conventional SIMOX and bonding processes. Due to this non-uniformity, the thickness in layer 14 may vary randomly across the SOI substrate.

Ideally, it would be beneficial if the superficial Si-containing layer has thickness uniformity across the entire length of the SOI substrate. In the prior art, it is known to control thickness uniformity of a SOI substrate by thinning in hydrogen, chemical mechanical polishing (CMP), or low temperature oxidation (at temperatures below about 1100° C.). The aforementioned prior art approaches to achieve thickness uniformity do not demonstrate sufficient thickness control needed with today's generation of CMOS devices.

Thus, there is a need for developing a method in which thickness uniformity can be readily achieved utilizing processing steps that do not adversely affect the SOI substrate. Moreover, a method is required which demonstrates sufficient thickness control to permit the use of SOI substrates with today's and future generation of CMOS devices.

SUMMARY OF THE INVENTION

One object of the present invention is to provide a method of improving the thickness uniformity of a SOI (preformed or in-situ) substrate.

Another object of the present invention is to provide a method of forming a SOI substrate having a SOI thickness of less than about 1000 Å.

Another object of the present invention is to provide a method of improving the thickness uniformity of SIMOX or bonded SOI substrates.

A yet further object of the present invention is to provide a method of improving the thickness uniformity of a SOI substrate that employs processing steps that do not adversely affect the SOI substrate.

A still further object of the present invention is to provide a method for achieving thickness uniformity of a SOI substrate which demonstrates sufficient thickness control to permit the SOI substrates to be used in fabricating high-performance semiconductor devices and circuits.

An even further object of the present invention is to provide a method of improving the thickness uniformity in a self-adjusting manner by using an internal thermal oxidation (ITOX) mechanism.

These and other objects and advantages are achieved in the present invention by subjecting a SOI substrate having thickness non-uniformity to high-temperature oxidation step. During the high-temperature oxidation the following two phenomena are believed to be taking place which aid in improving the thickness uniformity of the SOI substrate: (i) surface oxidation of the superficial Si-containing layer (i.e., the Si-containing layer present atop the buried oxide (BOX) region); and (ii) internal thermal oxidation (ITOX), i.e., diffusion of oxygen via the superficial Si-containing layer into the interface that exists between the BOX and the superficial Si-containing layer.

Regions of the SOI substrate which have thicker Si get less ITOX, but more surface oxidation creating a thicker surface oxide (and hence thinner superficial Si-containing layer). However, regions of the SOI substrate which are thinner get more ITOX and have thinner surface oxide (and hence a thicker superficial Si-containing layer). This mechanism continues to self-adjust the SOI substrate thickness with oxidation time to improve the SOI thickness uniformity. The same mechanism improves the surface roughness. It has been observed that the closer the oxidizing surface is to the BOX, the more uniform the superficial Si-containing layer 14 becomes.

A first method of the invention which is employed with a preformed SOI substrate (SIMOX or bonded) comprises the steps of: subjecting a preformed SOI substrate having thickness non-uniformity to a high-temperature oxidation process that is capable of improving the thickness uniformity of said SOI substrate, wherein said high-temperature oxidation is carried out at a temperature of about 1000° C. or above, preferably 1250° C. or above and in an oxygen-containing ambient that promotes surface oxide growth and internal thermal oxidation.

In accordance with the present invention, the preformed SOI substrates employed in the present invention include SOI substrates that are formed by conventional SIMOX or bonding techniques. Included within this definition are unpatterned or patterned SOI substrates that have a single or multiple buried oxide regions formed therein.

A second method of the present invention is directed to an in-situ process of preparing a SOI substrate wherein the inventive high-temperature oxidation step is used as a soak cycle prior to annealing. Specifically, the second method of the present invention comprises the steps of:

(a) implanting oxygen ions into a surface of a Si-containing substrate, said implanted oxygen ions having a sufficient concentration to form a buried oxide region in said Si-containing substrate;

(b) soaking said Si-containing substrate containing implanted oxygen ions in an oxygen-containing ambient at a temperature of about 1000° C. or above, preferably 1100° C. or greater for a time period of about 0.5 hours or greater; and (c) annealing said soaked Si-containing substrate containing said implanted oxygen ions under conditions that are capable of forming a SOI substrate having said buried oxide region which electrically isolates a superficial Si-containing layer from a bottom Si-containing layer, said SOI substrate having thickness uniformity.

In a third method of the present invention, the high-temperature oxidation step is used in a conventional SIMOX process following the annealing step. When this aspect is employed, a SIMOX process is provided that comprises the steps of:

(a) implanting oxygen ions into a surface of a Si-containing substrate, said implanted oxygen ions having a sufficient concentration to form a buried oxide region in said Si-containing substrate;

(b) annealing said Si-containing substrate containing said implanted oxygen ions under conditions that are capable of forming a SOI substrate having said buried oxide region which electrically isolates a superficial Si-containing layer from a bottom Si-containing layer, said SOI substrate having thickness non-uniformity; and (c) subjecting said SOI substrate having thickness non-uniformity to a high-temperature oxidation process that is capable of improving the thickness uniformity of said SOI substrate, wherein said high-temperature oxidation is carried out at a temperature of about 1000° C. or above, preferably 1250° C. or above, and in an oxygen-containing ambient that promotes surface oxide growth and internal thermal oxidation.

Another aspect of the present invention relates to a SOI substrate (or material) having thickness uniformity across the entire surface of the substrate, which is provided by one of the aforementioned methods. Specifically, the SOI substrate of the present invention comprises:

a buried oxide region that electrically isolates a superficial Si-containing layer from a bottom Si-containing layer, wherein said superficial Si-containing layer has a thickness which is substantially uniform across the entire substrate.

Because each of the methods of the present invention disclosed herein goes through an internal thermal oxidation mechanism, the buried oxide (BOX) regions of the present invention exhibit high structural as well as electrical qualities as compared to buried oxide regions formed using conventional ion implantation, wherein the inventive high-temperature heat treatment method of the present invention is not employed.

The term "high structural quality" is used herein to denote a SOI substrate which has little or no etch pitch density (less than about 1E5 cm$^{-2}$); little or no top Si roughness (on the order of less than about 6 Å root mean square), Si-buried oxide interface undulations of less than about 200 Å as measured by TEM (transmission electron microscopy) or SEM; and a low HF-defect density of less than about 1 cm$^{-2}$.

The term "high electrical quality" is used herein to denote a structure wherein the buried oxide breakdown field is high (greater than about 6 megavolts per cm); the buried oxide minibreakdown voltage is high (greater than about 5 megavolts per cm); and the buried oxide leakage at a given voltage is low (less than about 1 nanoAmp per cm$^{-2}$).

DETAILED DESCRIPTION OF THE INVENTION

The present invention which provides various methods of forming a SOI substrate having thickness uniformity across the entire surface of the substrate will now be described in more detail by referring to the following discussion as well as the drawings that accompany the present application. It is noted that in the accompanying drawings like and/or corresponding elements are referred to by like reference numerals.

Figure 2:
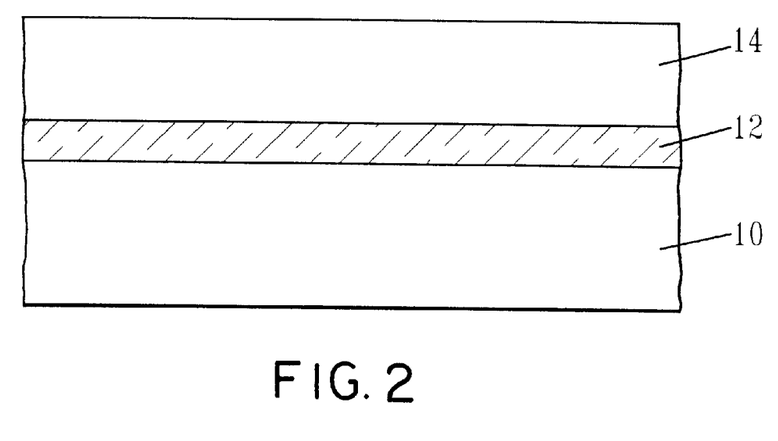
FIG. 2 is a pictorial representation (through a cross-sectional view) of an inventive SOI substrate which exhibits thickness uniformity across the entire surface of the substrate.

Reference is first made to FIG. 2 which is a pictorial representation of the inventive SOI substrate. Specifically, the inventive SOI substrate comprises buried oxide region 12 that electrically isolates superficial Si-containing layer 14 from bottom Si-containing layer 10. As is illustrated, superficial Si-containing layer 14 (and hence the SOI substrate) has a thickness which is substantially uniform across the entire substrate. The term "substantially uniform" denotes a superficial Si-containing thickness across the entire SOI substrate which is within about ±2% of a targeted thickness. It is noted that such thickness uniformity can not be obtained from using any of the methods mentioned in the background section of the instant application. Hence, the inventive SOI substrate as well as methods disclosed herein represent a significant advancement over prior art SOI substrates and methods which are employed for controlling the thickness uniformity of a SOI substrate.

Figure 3:
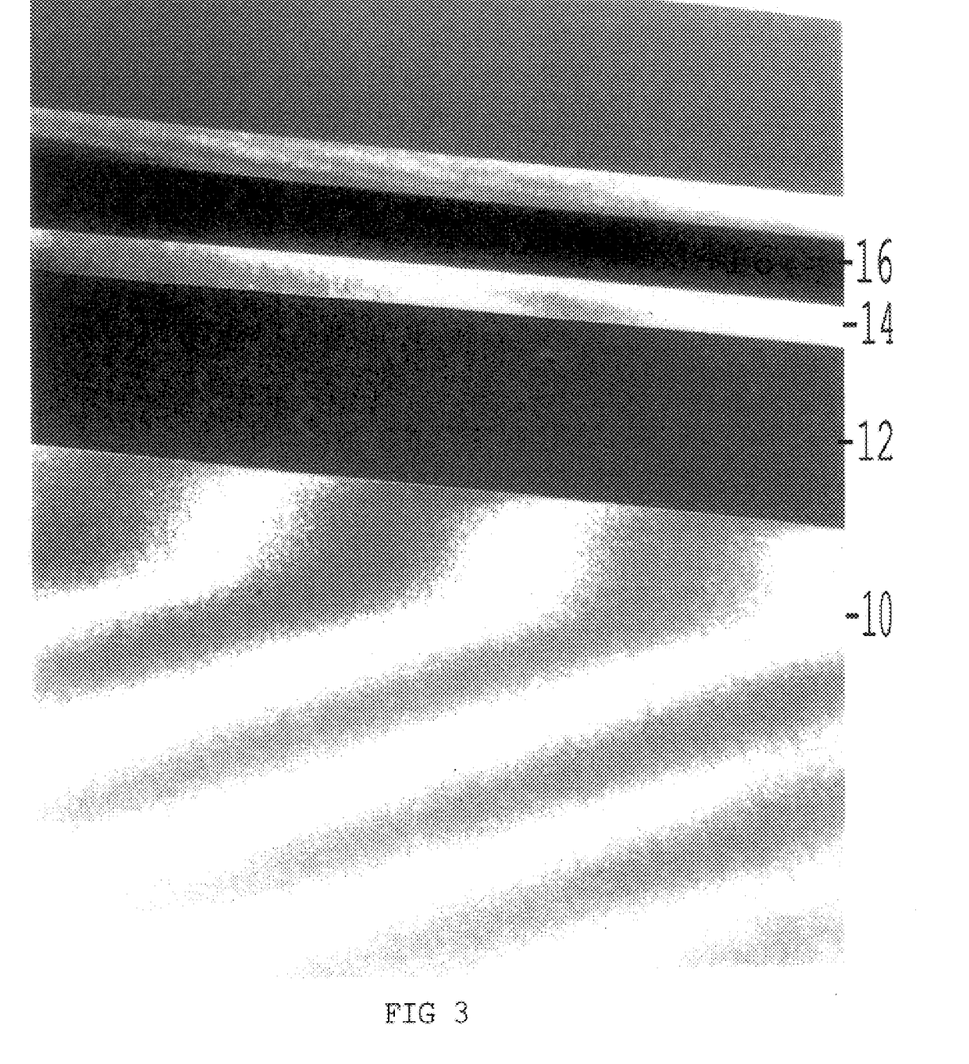
FIG. 3 illustrates the inventive SOI substrate via transmission electron microscopy (TEM).

FIG. 3 illustrates another view of an inventive SOI substrate via transmission electron microscopy (TEM). Note that the layer above superficial Si-containing layer 14 is a surface oxide that is formed over the superficial Si-containing layer during the inventive high-temperature oxidation process. The surface oxide layer which is labeled as element 16 in FIG. 3 can be removed from the SOI substrate by utilizing a conventional etching process that is highly selective in removing oxide as compared to Si. For example, HF may be used to remove the surface oxide layer that is formed during the inventive high-temperature oxidation process. Note that in FIG. 2 the SOI substrate is depicted as not containing the surface oxide layer.

The thickness of the BOX regions formed in the present invention may vary depending upon the exact embodiment used in fabricating the same. Typically, however, the BOX region of the present invention has a thickness of from about 500 to about 5000 Å, with a thickness of from about 1000 to about 2000 Å being more highly preferred. It should be noted that the BOX thickness reported herein is the mean thickness which is based upon a Gaussian distribution curve.

Insofar as the top superficial Si-containing layer is concerned, that Si-containing layer may have a variable thickness which is also dependent upon the exact embodiment used in fabricating the same. Typically, however, the superficial Si-containing layer of the SOI substrate of the present invention has a thickness of from about 100 to about 10,000 Å, with a thickness of from about 500 to about 2000 Å being more highly preferred. The thickness of the bottom Si-containing layer is inconsequential to the present invention.

The inventive SOI substrates shown in FIGS. 2–3 can be used in forming high-performance semiconductor devices and/or circuits. Examples of such devices and circuits that may contain the inventive SOI substrate include, but are not limited to: microprocessors, memory cells such as dynamic random access memory (DRAM) and static random access memory (SRAM), application specific integrated circuits (ASICs), and larger and more complicated structures. Since these devices are well known to those skilled in the art, it is not necessary to provide a detail description concerning the same. It is, however, emphasized that the active device and/or circuits are typically formed in the top superficial Si-containing layer, i.e., layer 14 of the SOI substrate.

The various methods used in obtaining the SOI substrates shown in FIGS. 2–3, which have improved thickness uniformity, will now be described in greater detail. Broadly speaking, each of the inventive methods includes a high-temperature oxidation step (either before or after annealing) that is capable of improving the thickness uniformity of a SOI substrate, wherein said high-temperature oxidation is carried out in an oxygen-containing ambient that promotes surface oxide growth and internal thermal oxidation.

It is emphasized that the inventive heat treatment step, i.e., high-temperature oxidation, may used with preformed SOI substrates; during the fabrication of a SOI substrate which includes the inventive high-temperature oxidation step as an intermediate soaking step followed by an annealing step; or during the fabrication of a SOI substrate which uses the inventive high-temperature oxidation step after ion implantation and annealing.

For example, when the inventive heat treatment step is used as a soaking step, the inventive method includes the steps of implanting oxygen ions into a surface of a Si-containing substrate, said implanted oxygen ions having sufficient concentration to form a buried oxide region in said Si-containing substrate; optionally conducting a second ion implantation process which is conducted at lower temperatures than the prior oxygen implant step; soaking the Si-containing substrate containing implanted oxygen ions in an oxygen-containing ambient at a temperature of about 1000° C. or greater for a time period of from about 0.5 hours or greater; and annealing said soaked Si-containing substrate containing said implanted oxygen ions under conditions that are capable of forming a SOI substrate having said buried oxide region which electrically isolates a superficial Si-containing layer from a bottom Si-containing layer, said SOI substrate having thickness uniformity.

In embodiments wherein the inventive method does not include an intermediate soak step, the inventive high-temperature oxidation step follows ion implantation and annealing.

Figure 1:
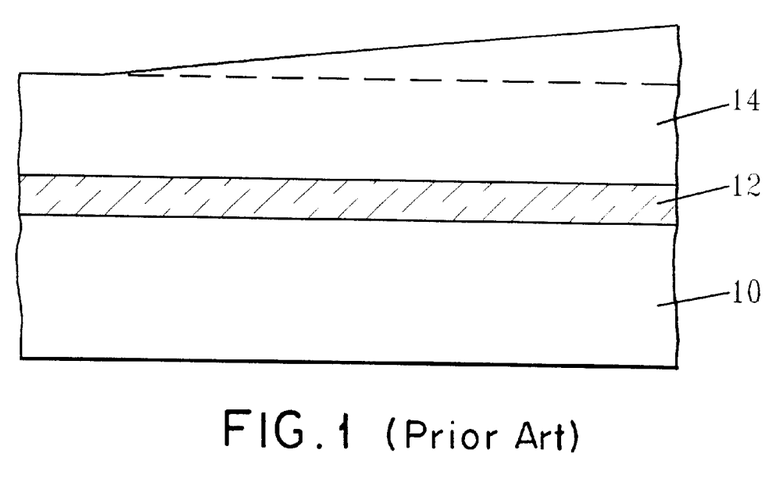
FIG. 1 is a pictorial representation (through a cross-sectional view) of a prior art SOI substrate which lacks thickness uniformity across the entire surface of the substrate.
Figure 4A:
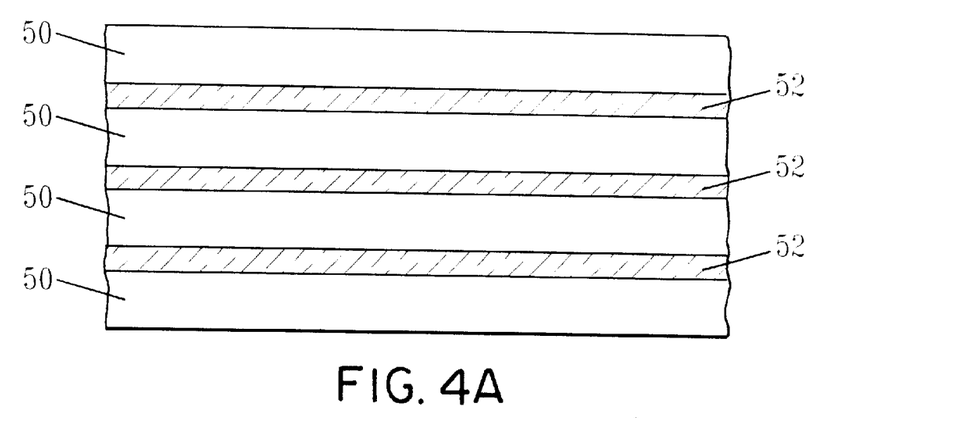
FIGS. 4A–4C are pictorial representations (through cross-sectional views) of various preformed SOI substrates that can be employed in the present invention.
Figure 4B:
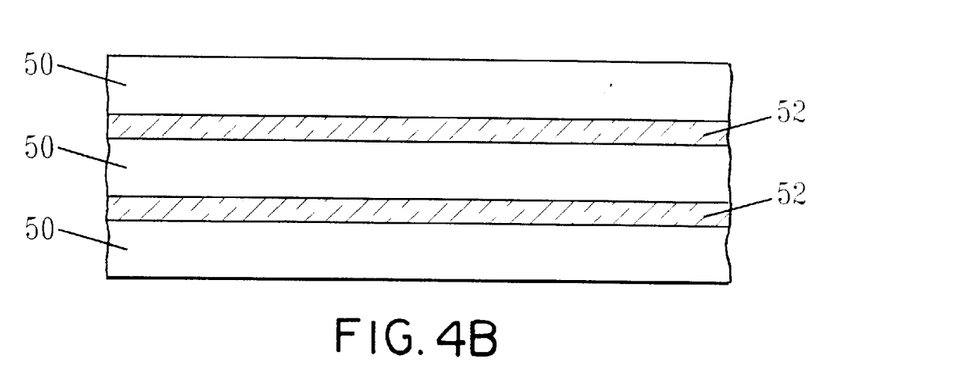
Figure 4C:
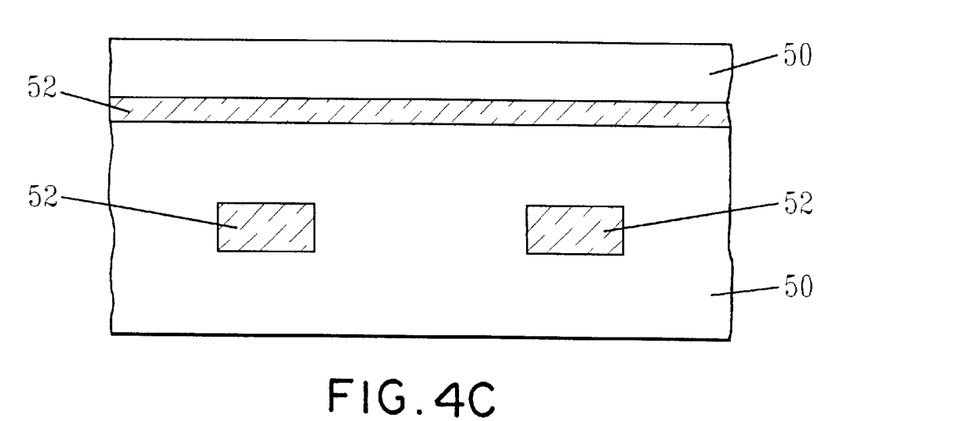

In the embodiment wherein a preformed SOI substrate (one of which is shown, for example, in FIG. 1) is employed, the preformed SOI substrate, which is subjected to the inventive high-temperature oxidation step, is fabricated utilizing conventional SIMOX or bonding processes that are well known to those skilled in the art. The preformed SOI substrate may contain a single buried oxide region as shown in FIG. 1, or the SOI substrate may include multiple buried oxide regions that are separated by Si-containing layers. In some instances, patterned SOIs having discrete buried oxide islands within a preformed SOI substrate may be employed. Examples of such preformed SOI substrates are shown, for instance, in FIGS. 4A–C. Note that in each of the figures, reference numeral 50 denotes a Si-containing layer, whereas reference numeral 52 denotes a buried oxide region.

Bonded SOI substrates may be formed by bonding and plasma thinning (so-called "Acuthin process"), bonding and smartcutting (so-called "Unibond process") or bonding and etching back (so-called "Si-bonding process").

The SIMOX SOI substrates are formed utilizing any conventional SIMOX process which includes oxygen ion implantation and annealing. Thus, for example, the SIMOX processes disclosed in U.S. Pat. No. 5,930,643 to Sadana, et al.; U.S. Pat. No. 6,043,166 to Roitman, et al.; and U.S. Pat. No. 6,090,689 to Sadana, et al., the entire contents of each of which is incorporated by reference, may be employed in the present invention.

Although any conventional SIMOX process may be employed in forming the SOI substrates (preformed or in-situ), the following description provides some more details concerning the oxygen ion implantation and annealing steps that may be employed in the present invention. It is noted that the Si-containing substrate used in forming the preformed SOI substrate or used in the in-situ methods of the present invention may be undoped or doped (p- or n-type) depending on its future use. The term Si-containing substrate denotes a substrate which comprises Si, SiGe, SiC, SiGeC, epi-Si/Si, epi-Si/SiGe, epi-Si/SiC or any combination or multilayer thereof.

I. High-dose Oxygen Ion Implantation

The term "high-dose" as used herein denotes an oxygen ion dosage of about 4E17 $cm^{-2}$ or greater, with an oxygen ion dosage of from about 4E17 to about 2E18 $cm^{-2}$ being more preferred. In addition to using high-oxygen dosage, this implant is typically carried out in an ion implantation apparatus that operates at a beam current of from about 0.05 to about 500 milliamps $cm^{-2}$ and at an energy of from about 120 to about 250 keV.

This implant, which may be referred to as a base ion implant, is carried out at a temperature of from about 200° to about 800° C. at a beam current density of from about 0.05 to about 500 mA $cm^{-2}$. More preferably, the base ion implant may be carried out at a temperature of from about 200° to about 600° C. at a beam current density of from about 5 to about 25 mA $cm^{-2}$.

If desired, the base oxygen implant step may be followed by a second oxygen implant that is carried out using an oxygen dose of from about 1E14 to about 1E16 $cm^{-2}$, with an oxygen dose of from about 1E15 to about 4E15 $cm^{-2}$ being more highly preferred. The second oxygen implant is carried out at an energy of from about 10 to about 1000 keV, with an energy of from about 120 to about 210 keV being more preferred.

This second implant is performed at a temperature of from about 4K to about 200° C. at a beam current density of from about 0.05 to about 10 mA $cm^{-2}$. More preferably, the second oxygen implant may be performed at a temperature of from about 25° to about 100° C. at a beam current density from about of 0.05 to about 10 mA $cm^{-2}$.

Note that the second oxygen implant forms an amorphous region below the damaged region caused by the base ion implant step. During the subsequent annealing, the amorphous and damaged regions are converted into a BOX region.

II. High-energy, High-dose Oxygen Implant

The term "high-dose" as used herein denotes an oxygen ion dose of about 4E17 cm$^{-2}$ or greater, with an oxygen ion dose of from about 5E17 to about 7E17 cm$^{-2}$ being more preferred. The term "high-energy", on the other hand, denotes an energy from about 60 keV or greater, with an implant energy of from about 250 to about 500 keV being more highly preferred.

This implant, which may be referred to as a base ion implant, is carried out at a temperature of from about 100° to about 800° C. with a beam current density of from about 0.05 to about 500 mA cm$^{-2}$. More preferably, the base ion implant may be carried out at a temperature of from about 300° to about 700° C. with a beam current density of from about 0.05 to about 500 mA cm$^{-2}$. If desired, the base oxygen implant step may be followed by a second oxygen implant that is carried out using an oxygen dose of from about 1E14 to about 1E16 cm$^{-2}$, with a dose of from about 1E15 to about 4E15 cm$^{-2}$ being more highly preferred. The second oxygen implant is carried out at an energy of 60 keV or greater with an energy of from about 200 to about 450 keV being more preferred.

This second implant is performed at a temperature of from about 4K to about 200° C. at a beam current density of from about 0.05 to about 10 mA cm$^{-2}$. More preferably, the second oxygen implant may be performed at a temperature of from about 25 to 100 C. with a beam current density of from about 0.5 to about 5 mA cm$^{-2}$.

III. Low-bose Oxygen Implant

The term "low-dose" as used herein for this embodiment of the present invention denotes an oxygen ion dose of about 4E17 cm$^{-2}$ or less, with an oxygen ion dose of from about 1E17 to about 3.9E17 cm$^{-2}$ being more preferred. This low-dose implant is performed at an energy of from about 40 to about 250 keV, with an implant energy of from about 100 to about 210 keV being more highly preferred.

This implant, which may be referred to as a base ion implant, is carried out at a temperature of from about 100° to about 800° C. More preferably, the base ion implant may be carried out at a temperature of from about 200° to about 650° C. at a beam current density of from about 0.05 to about 500 mA cm$^{-2}$.

If desired, the base oxygen implant step may be followed by a second oxygen implant that is carried out using the conditions mentioned above.

It is again emphasized that the above types of oxygen ion implantations are exemplary and by no way limit the scope of the present invention. Instead, the present invention contemplates all conventional oxygen ion implants that are typically employed in conventional SIMOX processes.

Following the implanting of oxygen ions into the surface of the Si-containing substrate, the substrate containing implanted oxygen ions may be subjected to an annealing step which is performed under conditions wherein said implanted oxygen ions form a buried oxide region which electrically isolates a superficial Si-containing layer from a bottom Si-containing layer.

In embodiments wherein the annealing step follows one of the above-mentioned ion implant steps, annealing is typically carried out in an ambient that includes from about 0.1 to about 100% oxygen and from about 99.9 to about 0% inert gas such as He, Ar, Kr, and N$_2$. In one preferred embodiment of the present invention, N$_2$ is employed as the inert gas. More preferably, the annealing step employed typically is carried out in an ambient that includes from about 0.1 to about 50% oxygen and from about 50 to about 99.9% inert gas. In an even more preferable embodiment of the present invention, 100% oxygen is employed.

This annealing is typically performed at a temperature of from about 1250° C. or above for a time period of from about 1 to about 100 hours. More preferably, annealing is performed at a temperature of from about 1300° to about 1350° C. for a time period of from about 2 to about 24 hours. Annealing may be carried out by simply heating the wafer at a specific ramp temperature to the targeted temperature, or various ramp and soak cycles may be employed. During the various ramp and soak cycles it is possible to vary the content of the annealing ambient within the ranges mentioned above and/or switch gases. The parameters for the ramp and soak cycles for the partial annealing may be the same as mentioned in previously incorporated U.S. Pat. No. 5,930,643 to Sadana, et al.

Note that the parameters for the ramp and soak cycles in the '643 patent may be adjusted herein to other ranges not reported in the '643 patent. For example, the ramp rate (heating and cooling) may be adjusted to be within the range of from about 0.1° C./min to about 10° C./min.

Notwithstanding whether the substrate is a preformed SOI formed by SIMOX or bonding or an in-situ prepared SOI substrate, the SOI substrate lacks thickness uniformity. Instead, and as shown in FIG. 1, the SOI substrates have a non-uniform thickness which hinders their use in high-performance semiconductor structures.

To improve the thickness uniformity of the SOI substrate, a high-temperature oxidation is carried out on the SOI substrate. The high-temperature oxidation may be performed after the SOI substrate is formed, or alternative, when a conventional SIMOX process, as described above, is employed in forming the SOI substrate. The inventive oxidation process may occur prior to or after the high-temperature annealing step mentioned above. In a preferred embodiment of the present invention, the oxidation process occurs prior to the high-temperature annealing step.

The term "high-temperature oxidation" is used herein to denote an oxidation process that is carried out a temperature of about 1000° C. or above and in an oxygen-containing ambient that promotes surface oxide growth and internal thermal oxidation. More preferably, the inventive oxidation step is carried out at a temperature of from about 1110° to about 1250° C.

The inventive oxidation process is typically carried out for a time period of from about 5 to about 500 minutes, with a time period of from about 120 to about 240 minutes being more preferred.

The oxidation step may be carried out by simply heating the wafer at a specific ramp temperature to the targeted temperature, or various ramp and soak cycles may be employed. During the various ramp and soak cycles it is possible to vary the content of the annealing ambient within the ranges mentioned above. Also, it is possible to change the annealing oxygen-containing gas during the various ramp and soak cycles. The parameters for the ramp and soak cycles may vary depending on the desired thickness needed to achieve thickness uniformity. For example, the ramp rate for the heating and/or cooling cycles may be within the range of from about 0.1° C./min to about 10° C./min and the a soak cycle at a targeted temperature may be for about 120 to about 240 minutes.

The oxygen-containing ambient employed in the present invention includes, but is not limited to: O$_2$, air, N$_2$O, NO, stream, H$_2$O and mixtures thereof. Of these various oxygen-containing ambients, it is preferred to use O$_2$ as the oxygen-containing gas. It is noted that the present invention also contemplates the use of oxygen-containing ambients that contain less than about 50% of an inert gas such as Ar, He, and N$_2$. Thus, the high-temperature oxidation step (or the soaking step) is performed in an oxygen-containing ambient that has a concentration of from about 50 to about 100%.

Note that when an in-situ SOI substrate is fabricated using the inventive high-temperature oxidation step as an intermediate soak cycle, the inventive high-temperature oxidation step is performed prior to the annealing step defined above. When such an embodiment is employed, the soaking step is performed in an oxygen-containing ambient at a temperature of about 1000° C. or greater for a time period of from about 0.5 hours or greater. More preferably, the soaking step of the present invention is carried out at a temperature of from about 1100° C. to about 1350° C. for a period of time of from about 0.5 to about 10 hours.

As stated above, two phenomena are believed to be taking place during the inventive high-temperature oxidation step. Specifically (i) surface oxidation of the superficial Si-containing (i.e., the Si-containing layer present atop the buried oxide (BOX) region) which forms an oxide layer that is removed by conventional etching processes; and (ii) internal thermal oxidation (ITOX), i.e., diffusion of oxygen via the superficial Si-containing layer into the interface that exist between the BOX and the superficial Si-containing layer. Uniformity is achieved since regions of the SOI substrate which have thicker Si get less ITOX, but more surface oxidation creating a thicker surface oxide (and hence thinner superficial Si-containing layer). However, regions of the SOI substrate which are thinner get more ITOX and have thinner surface oxide (and hence thicker superficial Si). This mechanism continues to self-adjust the SOI substrate thickness with oxidation time to improve the SOI thickness uniformity and surface roughness. It has been observed that the closer the oxidizing surface is to the BOX, the more uniform the superficial Si-containing layer becomes.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail what we claim as new and desire to secure by the Letters Patent is:

1. A method of improving thickness uniformity of a preformed silicon-on-insulator (SOI) substrate comprising the step of:
   subjecting a preformed SOI substrate having thickness non-uniformity to a high-temperature oxidation process that is capable of improving the thickness uniformity of said SOI substrate, wherein said high-temperature oxidation is carried out at a temperature of about 1000° C. or above and in an oxygen-containing ambient that promotes surface oxide growth and internal thermal oxidation.

2. The method of claim 1 wherein said preformed SOI substrate is formed by a separation by ion implantation of oxygen (SIMOX) process.

3. The method of claim 2 wherein said SIMOX process includes oxygen ion implantation and annealing.

4. The method of claim 3 wherein said oxygen ion implantation comprises a base oxygen implant step or a base oxygen implant step followed by a second oxygen implant step which is carried out at lower temperatures than said base oxygen implant step.

5. The method of claim 4 wherein said second oxygen implant step is carried out using an oxygen ion dose of from about 1E14 to about 1E16 cm$^{-2}$ and at an energy of from about 10 to about 1000 keV.

6. The method of claim 5 wherein said second oxygen implant step is carried out using an oxygen ion dose of from about 1E15 to about 4E15 cm$^{-2}$ and at an energy of from about 120 to about 210 keV.

7. The method of claim 4 wherein said second oxygen implant step is carried out at a temperature of from about 4K to about 200° C. at a beam current density of from about 0.05 to about 10 mA cm$^{-2}$.

8. The method of claim 7 wherein said second oxygen implant step is carried out at a temperature of from about 25° to about 100° C. at a beam current density of from about 0.05 to about 10 mA cm$^{-2}$.

9. The method of claim 4 wherein said base oxygen implant comprises a high-dose oxygen implant which is carried out using an oxygen ion dose of about 4E17 cm$^{-2}$ or greater.

10. The method of claim 9 wherein said high-dose oxygen implant is performed using an oxygen ion dose of from about 4E17 to about 2E18 cm$^{-2}$.

11. The method of claim 9 wherein said high-dose oxygen implant is carried out at an energy of from about 120 to about 250 keV.

12. The method of claim 9 wherein said high-dose oxygen implant is carried out at a temperature of from about 200° to about 800° C. at a beam current density of from about 0.05 to about 500 mA cm$^{-2}$.

13. The method of claim 9 wherein said high-dose oxygen implant is carried out at a temperature of from about 200° to about 600° C. at a beam density of from about 5 to about 25 mA cm$^{-2}$.

14. The method of claim 4 wherein said base oxygen implant comprises a high-energy, high-dose oxygen implant which is carried out using an oxygen ion dose of about 4E17 cm$^{-2}$ or greater and at an energy of about 60 keV or greater.

15. The method of claim 14 wherein said high-energy, high-dose oxygen implant is carried out using an oxygen ion dose of from about 5E17 to about 7E17 cm$^{-2}$ and at an energy of from about 250 to about 500 keV.

16. The method of claim 14 wherein said high-energy, high-dose oxygen implant is performed at a temperature of from about 100° to about 800° C. at a beam density of from about 0.05 to about 500 mA cm$^{-2}$.

17. The method of claim 16 wherein said high-energy, high-dose oxygen implant is performed at a temperature of from about 300° to about 700° C. at a beam density of from about 0.05 to about 500 mA cm$^{-2}$.

18. The method of claim 4 wherein said base oxygen implant comprises a low-dose oxygen implant which is carried out using an oxygen ion dose of about 4E17 cm$^{-2}$ or less.

19. The method of claim 18 wherein said low-dose oxygen implant is performed using an oxygen ion dose of from about 1E17 to about 3.9E17 cm$^{-2}$.

20. The method of claim 18 wherein said low-dose oxygen implant is carried out at an energy of from about 40 to about 250 keV.

21. The method of claim 20 wherein said low-dose oxygen implant is carried out at an energy of from about 100 to about 210 keV.

22. The method of claim 18 wherein said low-dose oxygen implant is carried out at a temperature of from about 100° to about 800° C. at a beam density of from about 0.05 to about 500 mA cm$^{-2}$.

23. The method of claim 22 wherein said low-dose oxygen implant is carried out at a temperature of from about 200° to about 650° C. at a beam density of from about 0.05 to about 500 mA cm$^{-2}$.

24. The method of claim 3 wherein said annealing is carried out in an ambient that comprises from about 0.1 to about 100% oxygen and from about 99.9 to about 0% inert gas.

25. The method of claim 24 wherein said annealing is carried out in an ambient that comprises from about 0.1 to about 50% oxygen and from about 50 to about 99.9% inert gas.

26. The method of claim 24 wherein said inert gas comprises He, Ar, Kr or $N_2$.

27. The method of claim 3 wherein said annealing is performed at a temperature of from about 1250° C. or above for a time period of from about 1 to about 100 hours.

28. The method of claim 27 wherein said annealing is preformed at a temperature of from about 1300° to about 1350° C. for a time period of from about 2 to about 24 hours.

29. The method of claim 1 wherein said preformed SOI substrate is formed by bonding.

30. The method of claim 1 wherein said high-temperature oxidation is carried out at a temperature of from about 1110° to about 1250° C.

31. The method of claim 1 wherein said oxygen-containing ambient comprises $O_2$, air, $N_2O$, NO, steam, $H_2O$ or mixtures thereof.

32. A SIMOX method for improving the uniformity of a SOI substrate, said method comprising the steps of:
   (a) implanting oxygen ions into a surface of a Si-containing substrate, said implanted oxygen ions having a sufficient concentration to form a buried oxide region in said Si-containing substrate;
   (b) soaking said Si-containing substrate containing implanted oxygen ions in an oxygen-containing ambient at a temperature of about 1000° C. or greater for a time period of about 0.5 hours or greater; and
   (c) annealing said soaked Si-containing substrate containing said implanted oxygen ions in an about 50 to about 100% oxygen-containing ambient under conditions that are capable of forming a SOI substrate having said buried oxide region which electrically isolates a superficial Si-containing layer from a bottom Si-containing layer, and said SOI substrate, having thickness uniformity.

33. The method of claim 32 wherein said soaking step is carried out at a temperature of from about 1100° to about 1350° C. for a period of time of from about 0.5 to about hours.

34. The method of claim 32 wherein said oxygen-containing ambient comprises $O_2$, air, $N_2O$, NO, steam, $H_2O$ or mixtures thereof.

35. The method of claim 32 wherein said soaking step is carried out in the present of from about 50 to about 100% of said oxygen-containing ambient.

36. A SIMOX method for improving the uniformity of a SOI substrate, said method comprising the steps of:
   (a) implanting oxygen ions into a surface of a Si-containing substrate, said implanted oxygen ions having a sufficient concentration to form a buried oxide region in said Si-containing substrate;
   (b) annealing said Si-containing substrate containing said implanted oxygen ions under conditions that are capable of forming a SOI substrate having said buried oxide region which electrically isolates a superficial Si-containing layer from a bottom Si-containing layer, said SOI substrate having thickness non-uniformity; and
   (c) subjecting said SOI substrate having thickness non-uniformity to a high-temperature oxidation process that is capable of improving the thickness uniformity of said SOI substrate, wherein said high-temperature oxidation is carried out at a temperature of about 1000° C. or above and in an about 50 to about 100% oxygen-containing ambient that promotes surface oxide growth and internal thermal oxidation.

37. The method of claim 36 wherein wherein high-temperature oxidation is carried out at 1250° C. or above.

38. The method of claim 36 wherein said oxygen-containing ambient comprises $O_2$, air, $N_2O$, NO, steam, $H_2O$ or mixtures thereof.

* * * * *

UNITED STATES PATENT AND TRADEMARK OFFICE
CERTIFICATE OF CORRECTION

| | | |
|---|---|---|
| PATENT NO. | : 6,602,757 B2 | Page 1 of 1 |
| APPLICATION NO. | : 09/861594 | |
| DATED | : August 5, 2003 | |
| INVENTOR(S) | : Harold J. Hovel et al. | |

It is certified that error appears in the above-identified patent and that said Letters Patent is hereby corrected as shown below:

Please add "MAURICE H. NORCOTT" as an inventor to the title page of the above identified patent.

Inventors should read: Harold J. Hovel, Katonah, NY (US)
Devendra K. Sadana, Pleasantville, NY (US)
Maurice H. Norcott, San Jose, CA (US)

Signed and Sealed this
Ninth Day of February, 2016

Michelle K. Lee
*Director of the United States Patent and Trademark Office*